United States Patent [19]

Mansfield

[11] 4,318,044
[45] Mar. 2, 1982

[54] METHODS OF INDICATING NUCLEAR SPIN DENSITY DISTRIBUTION

[75] Inventor: Peter Mansfield, Nottingham, England

[73] Assignee: National Research Development Corporation, London, England

[21] Appl. No.: 126,016

[22] Filed: Feb. 29, 1980

[30] Foreign Application Priority Data

Mar. 7, 1979 [GB] United Kingdom ............... 08040/79

[51] Int. Cl.³ ............................................. G01N 27/00
[52] U.S. Cl. ...................................... 324/309; 324/300
[58] Field of Search ................................ 324/300, 309

[56] References Cited

U.S. PATENT DOCUMENTS

| 4,021,726 | 5/1977 | Garroway | 324/309 |
| 4,115,730 | 9/1978 | Mansfield | 324/309 |

*Primary Examiner*—Michael J. Tokar
*Attorney, Agent, or Firm*—Cushman, Darby & Cushman

[57] ABSTRACT

Figure 4:
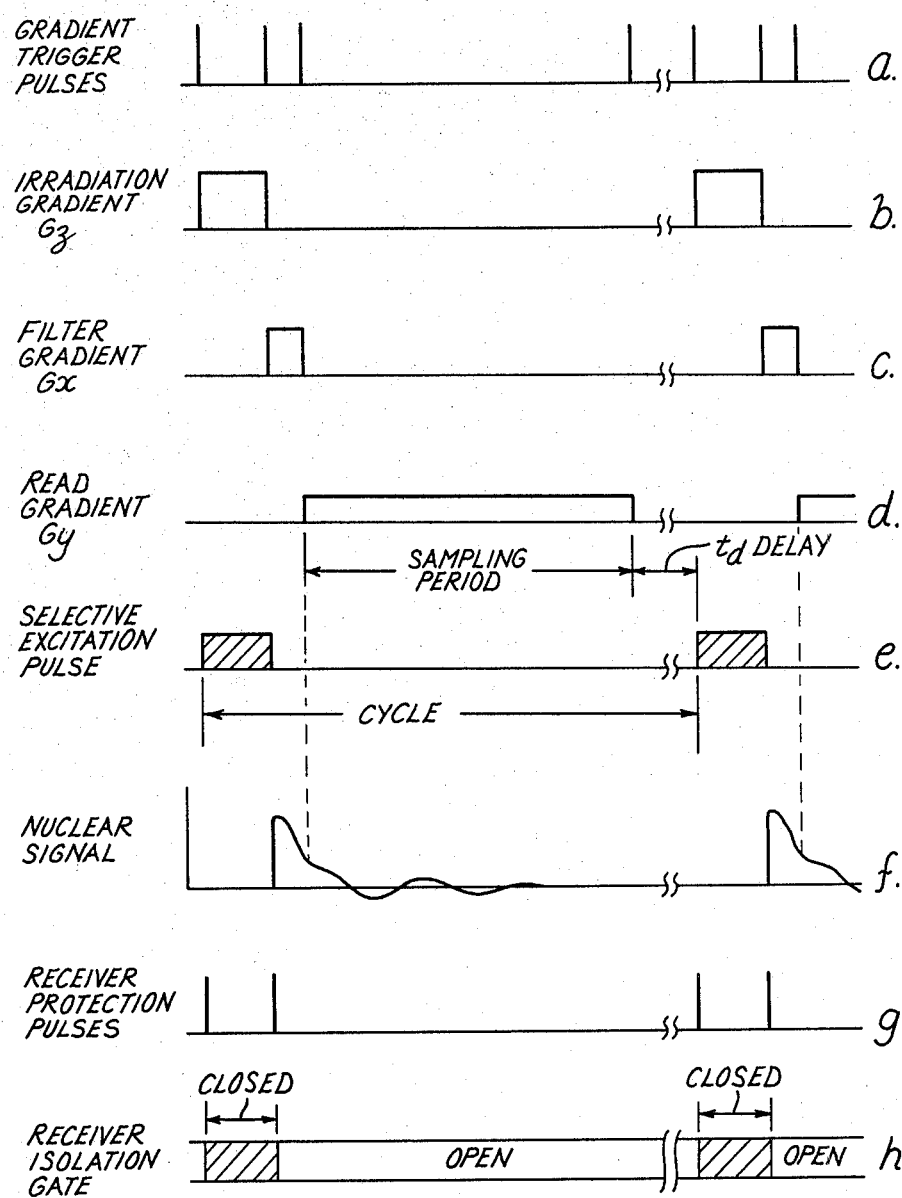

Spin density distribution in a sample subjected to a static magnetic field along a y-axis is determined by subjecting the sample to an initial magnetic field gradient Gz to the static field together with a 90° selective rf pulse to select a strip. The Gz gradient is then replaced by a filter gradient Gx for a limited period of time during which the free induction signal only partially decays and then immediately replacing the filter gradient by a read gradient Gy and then reading out the free induction decay signal. The sequence may be repeated cyclically with a delay between each cycle. (FIG. 4).

4 Claims, 15 Drawing Figures

+Gx

-Gx

SUM

METHODS OF INDICATING NUCLEAR SPIN DENSITY DISTRIBUTION

This invention relates to the indication of nuclear spin density distribution in materials. It has application in the formation of images of materials using nuclear magnetic resonance.

Apparatus for this purpose is described in UK Patent Specification number 1525564. In arrangements described therein a slice in a sample of material is initially selected by the use of radio frequency excitation pulses in combination with magnetic field gradients which provide a spatial variation of the static magnetic field along or orthogonal to its axis. The selected slice is then examined with suitably shaped rf pulses to examine the slice strip by strip across its width to build up the information necessary to reconstruct a two-dimensional image of spin density.

According to the invention in one aspect a method of indicating the spin density distribution in a sample of material containing nuclear spins comprises the steps of subjecting a sample to a static magnetic field along one axis, applying a first magnetic field gradient to said static magnetic field and a 90° radio frequency field to excite spins to select a strip in the sample, switching off the said first magnetic field gradient, applying a second magnetic field gradient to said static magnetic field which varies in one direction normal to the plane of a desired slice in the selected strip for a time which is limited so that the free induction decay signal does not reach an initial zero value, and then replacing the said second magnetic field gradient by a third magnetic field gradient to said static magnetic field which varies in a direction mutually orthogonal to the direction of the first and second magnetic field gradients, and reading out the resultant free induction decay signal representative of spins in the slice in the selected strip.

The initial selection of a slab in the sample may be achieved by any of the techniques in UK Patent Specification number 1525564. Thus the 90° rf pulse may be applied in combination with an initial magnetic field gradient to the static magnetic field.

Figure 1:
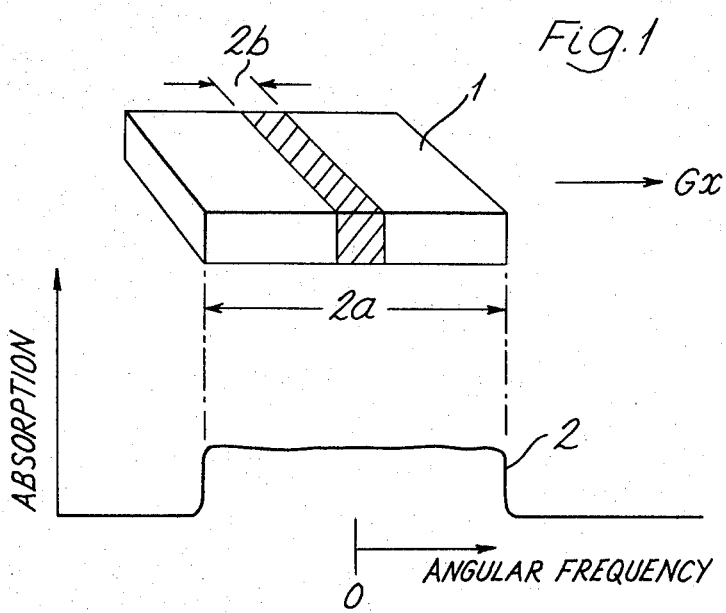
Figure 5A:
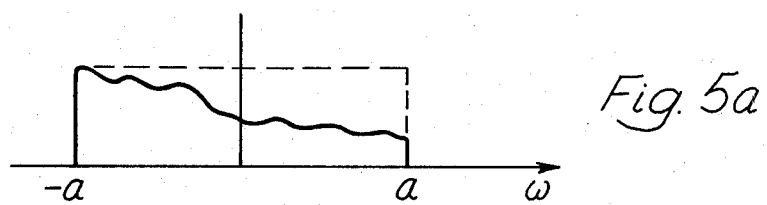
Figure 5B:
Figure 2:
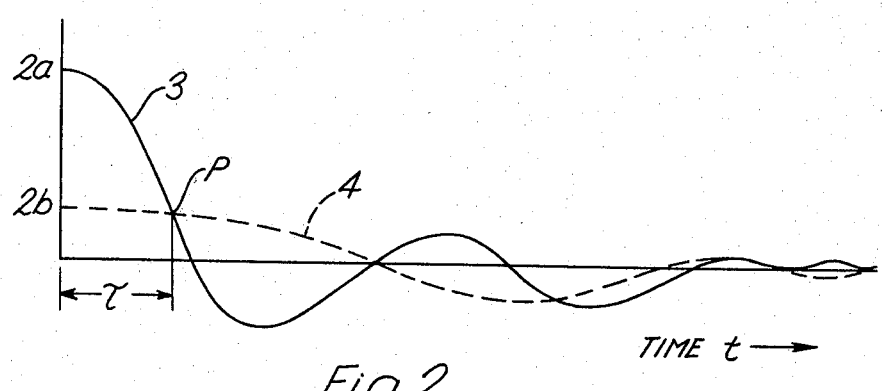
Figure 3A:
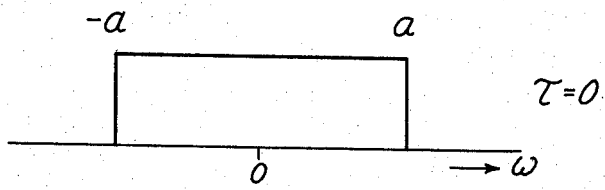
Figure 3B:
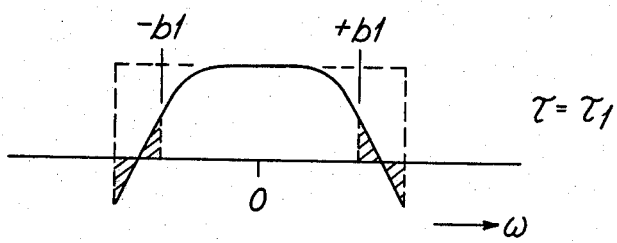
Figure 3C:
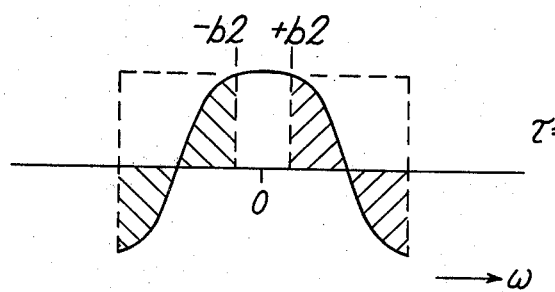
Figure 6A:
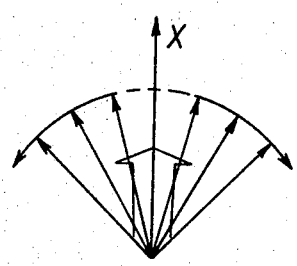
Figure 6B:
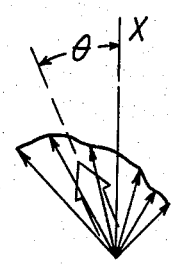
Figure 7A:
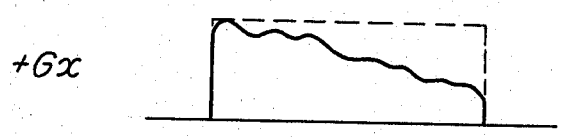
Figure 7B:
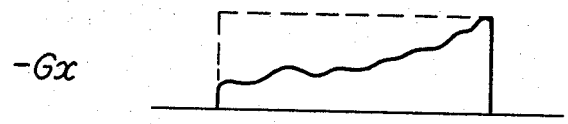
Figure 7C:
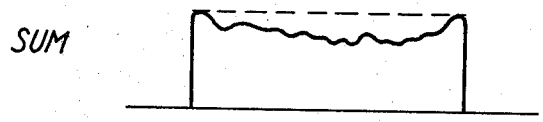
Figure 8B:
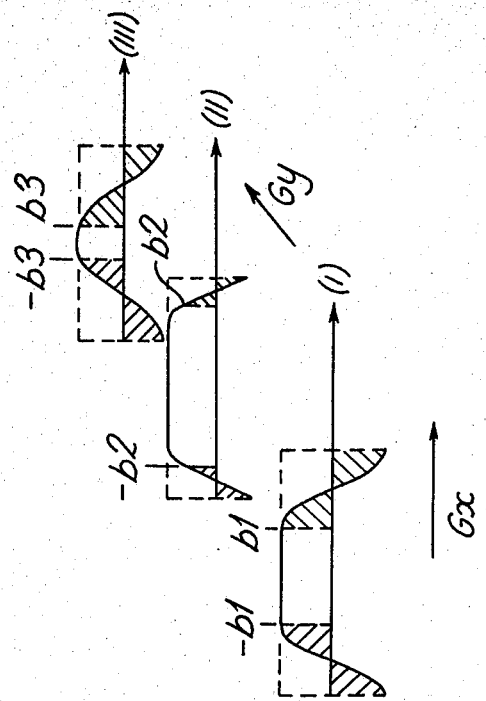
Figure 8A:
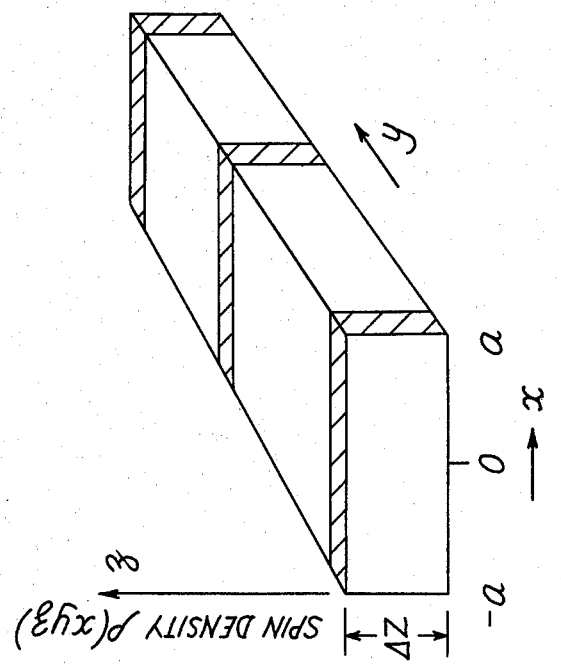

In order that the invention may be more fully understood reference will now be made to the accompanying drawing in which:

FIG. 1 shows a slab of a homogeneous sample and the corresponding absorption profile, FIG. 2 illustrates the FID signal from the slab and a selected slice in the slab, FIG. 3a–3c shows various spin distributions as functions of delay time when a read gradient is applied, FIG. 4 illustrates the various steps in the method, FIG. 5a and 5b show the effective spin distributions for nonhomogeneous slices with and without filtering, FIGS. 6a and 6b illustrate the angular difference caused by nonhomogeneous slices, FIGS. 7a–7c illustrate non-filtered absorption profiles obtained with gradient reversal, and FIGS. 8a and 8b show the effective spin distribution existing in various slices in a slab with filtering.

Referring to FIG. 1 there is shown therein a slab 1 of material which is subject to static magnetic field and in addition to a spatially varying gradient Gx to that magnetic field. The slab has a length $2a$ in the gradient direction. The relationship between NMR absorption and angular frequency in the slab is as shown underneath in curve 2. If the free induction decay signal of this slab is observed at resonance the Fourier transform of the rectangular absorption profile will be as shown in the curve 3 in FIG. 2. This curve is a sinc function of time $f(t) = 2a$ sinc at. If the slab were shorter and had a length $2b$ then the corresponding free induction decay signal would likewise be a sinc function of form $f(t) = 2b$ sinc bt. This is shown dotted in FIG. 2 as curve 4.

The two curves 3 and 4 intersect at point P at a time $\tau$ after commencement of the free induction decay signal. At this instant in time therefore the entire signal is derived from the narrower slice within the broad slab. Accordingly if the initial gradient which was maintained during the time $\tau$ is switched off when the instant defined by point P is reached and is replaced by another gradient Gy orthogonal to Gx then the resulting free induction decay signal that ensues will be derived entirely from the narrower slice in the broad slab. By this means a filtering process has been achieved in which all signals emanating from spins in the slab outside the narrow slice are eliminated. For the process to be effective $\tau$ must be less than the time to reach the initial zero crossing point.

The process may be better understood by drawing a plot of the effective spin distribution $g(\omega)$ as a function of the filtering time. For example when $\tau = 0$ $g(\omega)$ is the original rectangular distribution shown at (a) in FIG. 3. However, if $\tau \neq 0$ it is possible to plot sinc $\omega\tau$ against $\omega$ over the range $\omega \pm a$ to obtain the curve (b) for $\tau = \tau 1$ and (c) for $\tau = \tau 2$. Cancellation of the shaded areas demonstrates how the filtering process actually occurs to give a nett positive signal coming from a narrower distribution of width $\pm b1$ in curve (b) or width $\pm b2$ in curve (c).

Having selected a slice of spin magnetisation in this way the magnetic field gradient Gx is switched off and a new one Gy orthogonal thereto is switched on in order to observe the remaining spin magnetisation distribution along the y axis.

A complete sequence of excitation pulse and switched magnetic gradients for a full 3-dimensional imaging scheme using the filtering process is shown in FIG. 4. All the steps shown therein are drawn to a common time scale which shows one cycle of operation. Line (a) shows the sequence of trigger pulses which switch the various field gradients to the static magnetic field on and off. Initially an irradiation gradient Gz, being a magnetic field gradient in the z-direction is switched on by the first trigger pulse in line (a) and simultaneously therewith a selective excitation pulse is applied as shown in line (e). The combination of these two items causes the initial selection of a strip in the sample of material. The excitation pulse and the gradient Gz are then switched off as indicated by the second trigger pulse in line (a) and a filter gradient Gx is switched on for a limited period of time $\tau$ as explained above. This period terminates on receipt of the third trigger pulse and thereupon gradient Gx is switched off and is replaced by a read gradient Gy which is maintained for a sampling period. This sampling period is terminated by the fourth trigger pulse and a time delay td is then allowed before the next cycle commences. The nuclear magnetic signal detected from the sample is shown in line (f). The part of the signal available during the sampling period is read out and is Fourier transformed to give the absorption profile of a thin slice within the selected strip. The initial part of the nuclear signal before the sampling period is not used.

In carrying out the invention it is desirable to close the input gate to the receiver for the period during which the selective excitation pulse is applied and this may be achieved by the use of receiver protection pulses synchronised with the gradient trigger pulse as shown in line (g). These pulses isolate the receiver as shown in line (h).

The particular selection procedure described with reference to FIG. 4 can be used in conjunction with line scan imaging methods, projection reconstruction methods, planar, echo-planar and Fourier imaging methods to define the slice of spins being observed, and in the last case obviates the need for a selective rf pulse to define the plane, but requires a short non-selective pulse to interact with a larger volume of spins from which the defined slice is subsequently isolated.

The method described above works accurately for a homogeneous spin distribution. However, if the initial spin distribution along the x-axis of the specimen is not homogeneous, the initial absorption projection profile counterpart of FIG. 1 is shown at (a) in FIG. 5 and is an asymmetric absorption profile. Now the evolution of this asymmetric distribution will of course be similar to the symmetric FID signal of FIG. 3, but modified by the actual distribution weighting as shown at (b) in FIG. 5. The effects of a non-symmetric weighting, is, amongst other things, to shift the centre of "gravity" of the distribution (in this case) down frequency. This corresponds, in the frame of reference rotating at resonance $\omega_o$, to a phase shift of the signal. FIG. 6a shows the evolution of spin magnetisation in the rotating frame of resonance when the spin distribution is symmetric as in FIG. 1, while FIG. 6b shows the case for a non-symmetric distribution as in FIG. 5 indicating a phase shift $\theta$ between the effective magnetisation and the x-axis in the rotating reference frame.

To overcome this phase effect it is necessary to symmetrize the "effective" spin distribution. This may be achieved by (a) observing alternate FID's in alternate filter gradients Gx and −Gx or (b) by recording half the averaged FID in +Gx and adding to it an equal number of FID's in −Gx. The advantage of (b) is that Gx is reversed only once in the experiment. Either way, however, the observation of combined FID's in Gx is equivalent to symmetrizing the absorption line. FIG. 7a shows an asymmetric distribution in +Gx, and FIG. 7b is the same distribution with field gradient reversed to −Gx. FIG. 7c shows the Fourier transform of the combined FID's corresponding to FIGS. 7a and 7b. In this case the phase shift is restored to zero.

For a non-homogeneous distribution there is another matter to consider, particularly in the evolution of the spin system following filtering when Gx=0 and Gy is switched on.

Assume that the effective absorption profile has been symmetrized and that the block of spins (non-homogeneous) is as in FIG. 8(a). Consider three layers in this block. Layer (i) when symmetrized will evolve in time as in 8(b) to define a narrower filtered width of ±b1; Layer (ii) being a different distribution, and hence weighting, will, when symmetrized give, after the same evolution time $\tau$, a narrowed distribution ±b2. Likewise layer (iii) gives a narrowed distribution width ±b3.

Thus a layer of constant thickness ±b is not defined by this process except when the original spatial distribution in each layer is identical. However, provided that a is much great than average narrowed width <b>, a "plane" or slice of the average thickness <b> is defined but will undulate in an unpredictable manner because the spin density distribution $\rho(xz)$ for a given plane or layer at y is different for each value of y.

Even if $\Delta z$ is made small by selective irradiation so that $\rho(z)$ is constant, there will still be substantial variations of $\rho(x)$ with x within a given plane and as between planes.

Thus this method does not define an accurate smooth slice of spins. But the fuzzy slice will maintain its distribution along x. Each layer will therefore precess at its centre frequency given by $Wy = \Delta y \gamma Gy$. Thus provided this fuzziness is not too important, the method is selective in the slice and along a strip.

A question of some importance is what precisely determines <b>. To answer this at least in part, the homogeneous distribution is considered. The loss of signal at time $\tau$ in curve 3 of FIG. 2 corresponds to the cancellation in the integral.

$$I = 0 = a_b \int^{-b}[g_+(\omega) + g_-(\omega)]\mathrm{sinc}(\omega\tau)d\omega$$

where $g_\pm(\omega) = 1$ and the + and − refer to the direction of the applied gradient Gx. Now when $g_\pm(\omega)$ is not constant, the weighting of the integral will be such that to make I=0 for each layer at y, the integral limits ±b must be suitably varied. It is this point which makes the defined layer undulate in thickness. The filter time can be chosen in general so as to define $$<b> = b_o$$

with a variance of ±Δb. The variance arises from the inhomogeneity of the spin density distribution $\rho(xyz)$, and cannot be anticipated easily without prior knowledge of $\rho(xyz)$, the quantity it is desired to measure.

I claim:

1. A method of indicating the spin density distribution in a sample of material containing nuclear spins comprising the steps of subjecting a sample to a static magnetic field along one axis, applying a first magnetic field gradient to said static magnetic field and a 90° radio frequency field to excite spins to select a strip in the sample, switching off the said first magnetic field gradient, applying a second magnetic field gradient to said static magnetic field which varies in one direction normal to the plane of a desired slice in the selected strip for a time which is limited so that the free induction decay signal does not reach an initial zero value, and then replacing the said second magnetic field gradient by a third magnetic field gradient to said static magnetic field which varies in a direction mutually orthogonal to the direction of the first and second magnetic field gradients, and reading out the resultant free induction decay signal representative of spins in the slice in the selected strip.

2. The method as claimed in claim 1 in which the said sequence of steps is repeated cyclically with a time delay between each cycle.

3. The method as claimed in claim 2 in which the said second magnetic field gradient is reversed in direction in successive cycles.

4. The method as claimed in claim 2 in which the sequence is repeated for a predetermined number of cycles and then for a corresponding number of cycles but with the said second magnetic field gradient reversed.

* * * * *